US012626758B2

(12) United States Patent
McCombs, Jr. et al.

(10) Patent No.: US 12,626,758 B2
(45) Date of Patent: May 12, 2026

(54) COMPARE CIRCUITRY FOR A FAST AND GLITCHLESS COMPARE IN MEMORY

(71) Applicant: Arm Limited, Cambridge (GB)

(72) Inventors: Edward Martin McCombs, Jr., Austin, TX (US); Akshay Kumar, New Delhi (IN)

(73) Assignee: ARM LIMITED, Cambridge (GB)

( * ) Notice: Subject to any disclaimer, the term of this patent is extended or adjusted under 35 U.S.C. 154(b) by 170 days.

(21) Appl. No.: 18/678,682

(22) Filed: May 30, 2024

(65) Prior Publication Data

US 2025/0372160 A1 Dec. 4, 2025

(51) Int. Cl.
*G11C 7/00* (2006.01)
*G11C 11/419* (2006.01)
(52) U.S. Cl.
CPC .................................. *G11C 11/419* (2013.01)
(58) Field of Classification Search
CPC .................................................... G11C 11/419
See application file for complete search history.

(56) References Cited

U.S. PATENT DOCUMENTS

| | | | | |
|---|---|---|---|---|
| 8,599,626 B2 * | 12/2013 | Hold | .................... | G11C 7/1006 |
| | | | | 365/189.15 |
| 2010/0182816 A1 * | 7/2010 | Burda | ............... | G06F 16/90339 |
| | | | | 365/49.17 |
| 2016/0259676 A1 * | 9/2016 | Tomishima | ........... | G06F 3/0679 |

* cited by examiner

*Primary Examiner* — Min Huang
(74) *Attorney, Agent, or Firm* — Talem IP Law, LLP

(57) ABSTRACT

A compare circuitry that can be implemented in a memory circuit includes: selection logic coupled to a sense amplifier of the memory circuit, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and an XNOR gate structured to receive the column output and the column output bar passed through the selection logic, a data input, and a data input bar and output a bit compare output.

20 Claims, 6 Drawing Sheets

100

230

260

240

220 n-input
NAND

250

215

210

200

A<0>
B<0>

A<1>
B<1>

A<2>
B<2>

A<3>
B<3>

Two n-bit
numbers

FIG. 2

COMPARE CIRCUITRY FOR A FAST AND GLITCHLESS COMPARE IN MEMORY

BACKGROUND

Compare circuitry refers to the various digital logic circuits that can be used to compare the binary values of two or more bits to each other. One type of compare circuitry is an equality comparator, which checks for whether inputs are equal to each other. That is, an equality comparator produces an output indicating whether the binary values of the input bits are equal to each other (e.g., producing a 1 if the inputs are both 1s or both 0s). The XNOR gate is a logic gate that can be used as an equality comparator.

An equality comparator is a common compare circuitry used in computing hardware, for example, for performing memory address lookups from a tag memory. In such applications, a tag portion of an address for lookup is compared to the tag portions of the addresses stored in the tag memory to determine a hit (or miss).

Circuit performance along critical paths, pipeline latency, and power consumption are areas in a circuit design that are of interest for optimization. Accordingly, each aspect of a circuit's design, including a circuit design's compare circuitry, can benefit from such optimization.

BRIEF SUMMARY

Compare circuitry for a fast and glitchless compare in memory is provided. Incorporating compare circuitry in memory is beneficial for speeding up operations involving comparisons as well as for reducing power consumption. Indeed, the described compare circuitry provides speed optimization by its design and topology. Further, the described compare circuitry enables an output of the comparison only when a sense amplifier enable signal for the memory is active, which minimizes glitching power. As such, embodiments of the described compare circuitry are suitable for generating a hit/miss signal for tag lookup.

The fast and glitchless compare provided within a memory circuit can generate an output, e.g., a hit/miss signal, inside memory quickly with minimum glitching power.

A memory circuit for performing a compare in memory can include: a memory array; read circuitry coupled to columns of the memory array, the read circuitry including a sense amplifier; and a compare circuitry including: selection logic coupled to the sense amplifier, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and an XNOR gate structured to receive the column output and the column output bar passed through the selection logic, a data input, and a data input bar and output a bit compare output.

A method of performing a compare in memory can include: receiving, at a memory circuit, an address for lookup and a data input for comparing to stored data, wherein the memory circuit includes a memory array, read circuitry coupled to columns of the memory array; and a compare circuitry coupled to the read circuitry; providing a sense amplifier enable signal and column select signals of the address for lookup to the read circuitry; and comparing stored data from the address for lookup with the data input, wherein the comparing includes: providing the sense amplifier enable signal to selection logic of the compare circuitry, wherein the selection logic is structured receive the sense amplifier enable signal, a column output from a sense amplifier of the read circuitry, and a column output bar from the sense amplifier, the selection logic being further structured to pass through the column output and the column output bar when the sense amplifier enable signal is active and hold the column output and the column output bar at a same value when the sense amplifier enable signal is inactive; and providing the data input to an XNOR gate that is structured to receive the column output comparing the data input and the column output bar passed through the selection logic, the data input, and a data input bar, the XNOR gate being structured to output a bit compare output.

A compare circuitry that can be used for a fast and glitchless compare can include selection logic coupled to a sense amplifier of a memory circuit, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and an XNOR gate structured to receive the column output and the column output bar passed through the selection logic, a data input, and a data input bar and output a bit compare output.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 2 illustrates an example implementation of compare circuitry for the memory circuit of FIG. 1.

DETAILED DESCRIPTION

Compare circuitry for a fast and glitchless compare in memory is provided. Incorporating compare circuitry in memory is beneficial for speeding up operations involving comparisons as well as for reducing power consumption. Indeed, the described compare circuitry provides speed optimization by its design and topology. Further, the described compare circuitry enables an output of the comparison only when a sense amplifier enable signal for the memory is active, which minimizes glitching power. In this manner, the described compare circuitry provides a glitchless-capable compare circuitry that minimizes glitches caused by spurious transitions. Spurious transitions are transitions that do not contribute to the final value of the output, such as a signal that starts from 0 and stays at 0 goes through 0→1 and 1→0 transitions transiently and temporarily.

Embodiments of the described compare circuitry are suitable for generating a hit/miss signal for tag lookup. For example, certain embodiments of the fast compare circuitry used within a memory circuit can deliver the hit/miss signal within 5% after the standard access time of the memory with no spurious glitching.

Random Access Memory (RAM) is a type of volatile memory typically used as the main or primary memory for a processing unit and stores the programs and data that the processing unit is using during execution of a program. Static Random Access Memory (SRAM) is typically the type of memory used for caches, including tag RAMs. SRAM is generally configured as a memory circuit with a memory array, or matrix, of memory units that are individually addressable, a control circuit, a wordline driver, and input/output circuitry.

The basic lookup operation performed using a tag RAM includes determining whether an incoming address exists within the tag RAM. The stored contents of the memory are read out and compared with the incoming address. If the stored contents of the memory match the incoming address, a hit signal is generated. If the stored contents of the memory do not match the incoming address, a miss signal is generated. However, a memory circuit can be provided for use as a tag RAM in which compare circuitry is incorporated. Such a memory circuit can enable the compare operation to be performed as part of a read operation of the memory, which can reduce pipeline latency and power consumption.

Figure 1:
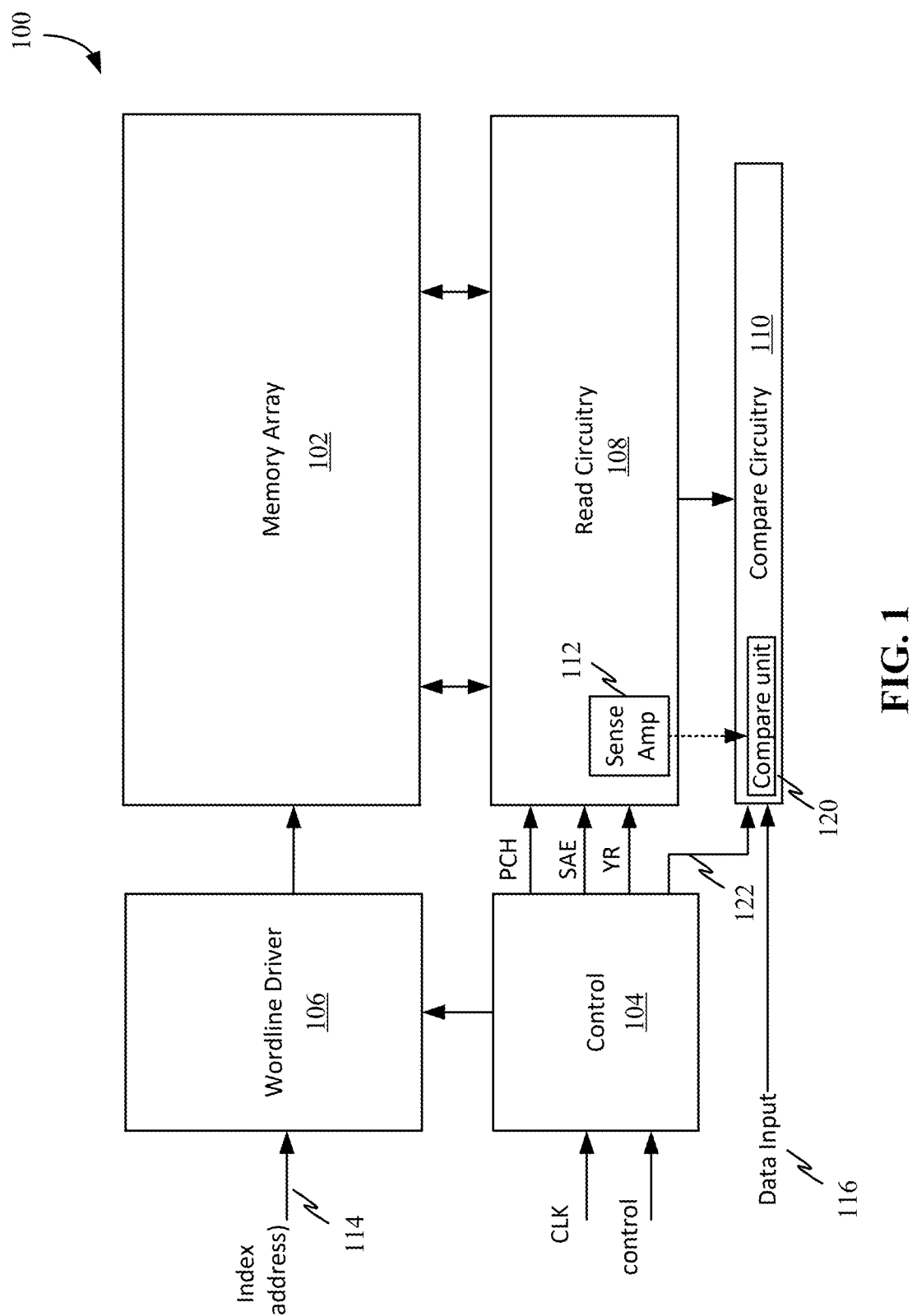
FIG. 1 illustrates a representational diagram of a memory circuit with compare circuitry.

FIG. 1 illustrates a representational diagram of a memory circuit with compare circuitry. Referring to FIG. 1, memory circuit 100 includes a memory array 102, a control circuit 104, a wordline driver 106, read circuitry 108, and compare circuitry 110.

The memory array 102 is structured as an array of bitcells with rows accessed by wordlines and columns accessed by bitlines. Each bitcell refers to the memory element storing a single bit of information. In certain implementations, memory array 102 is SRAM. The control circuit 104 provides control signals for operations of the memory circuit 100. These control signals include a sense amplifier enable (SAE) signal, a precharge (PCH) signal, and a read column select (YR) signal. The control circuit 104 can also provide a clock signal (e.g., as signal 122, which can be based on the CLK received at the control circuit 104) to the compare circuitry 110. The wordline driver 106 receives an address 114 and turns on a wordline indicated by the address 114 in response to receiving a signal from the control circuit 104. The read circuitry 108 contains circuitry that utilizes bitlines to read data from the wordline turned on by the wordline driver 106 out of the memory array 102.

In general, wordlines are used to select a row for reading or writing and bitlines carry data to/from a column. For the read operation in a memory such as SRAM, the address of a storage location of a word is transferred to an address line, a pre-charge circuit is used to bring bitlines to VDD (and to pre-charge a sense amplifier 112), the wordline is driven high (pre-charge circuit is turned off), the cells storing the data at the storage location pull down one bitline, and a sense circuit (including the sense amplifier 112) on a periphery of the array is activated to capture the value on the bitlines. In detail, the read cycle may be started by precharging the bitlines (e.g., bitline and bitline bar of each bitcell). When a wordline is asserted, the access transistors of a cell are enabled, which can cause one bitline voltage to slightly drop, resulting in a small voltage difference between the bitline and bitline bar. The sense amplifier 112 within the read circuitry 108 and coupled to a corresponding column of the memory array 102 can sense which line has the higher voltage and thus determine whether there was 1 or 0 stored. Control circuit 104 can be used to provide control signals to the wordline driver 106 and sends the PCH signal and YR signal(s) to read circuitry 108.

With the inclusion of compare circuitry 110, it is possible to perform a compare in the memory circuit 100 as part of a read operation. Compare circuitry 110 stores the received data input 116 at the beginning of the CLK cycle (e.g., based on CLK signal 122), and is able to perform a comparison of received data input 116 and a stored subset of bits from memory array 102 using the index 114 to select the row and YR (column select) to select the columns. Compare circuitry 110 includes a compare unit 120 that includes logic to perform a comparison between one or more bits of data input 116 and one or more bits of the stored data output from one or more sense amplifiers 112. A compare unit 120 supports the comparison of two n-bit numbers. The compare circuitry 110 can include a plurality of compare units 120 for comparing data input 116 to multiple n-bit numbers stored in the memory circuit 100.

In some implementations, when memory circuit 100 is used for tag memory, the compare circuitry 110 supports determination of a hit/miss of tag bits of the tag stored within the memory circuit 100. In this case, the data input is a tag bit of an address for lookup and the column output is a stored tag bit.

Figure 2:
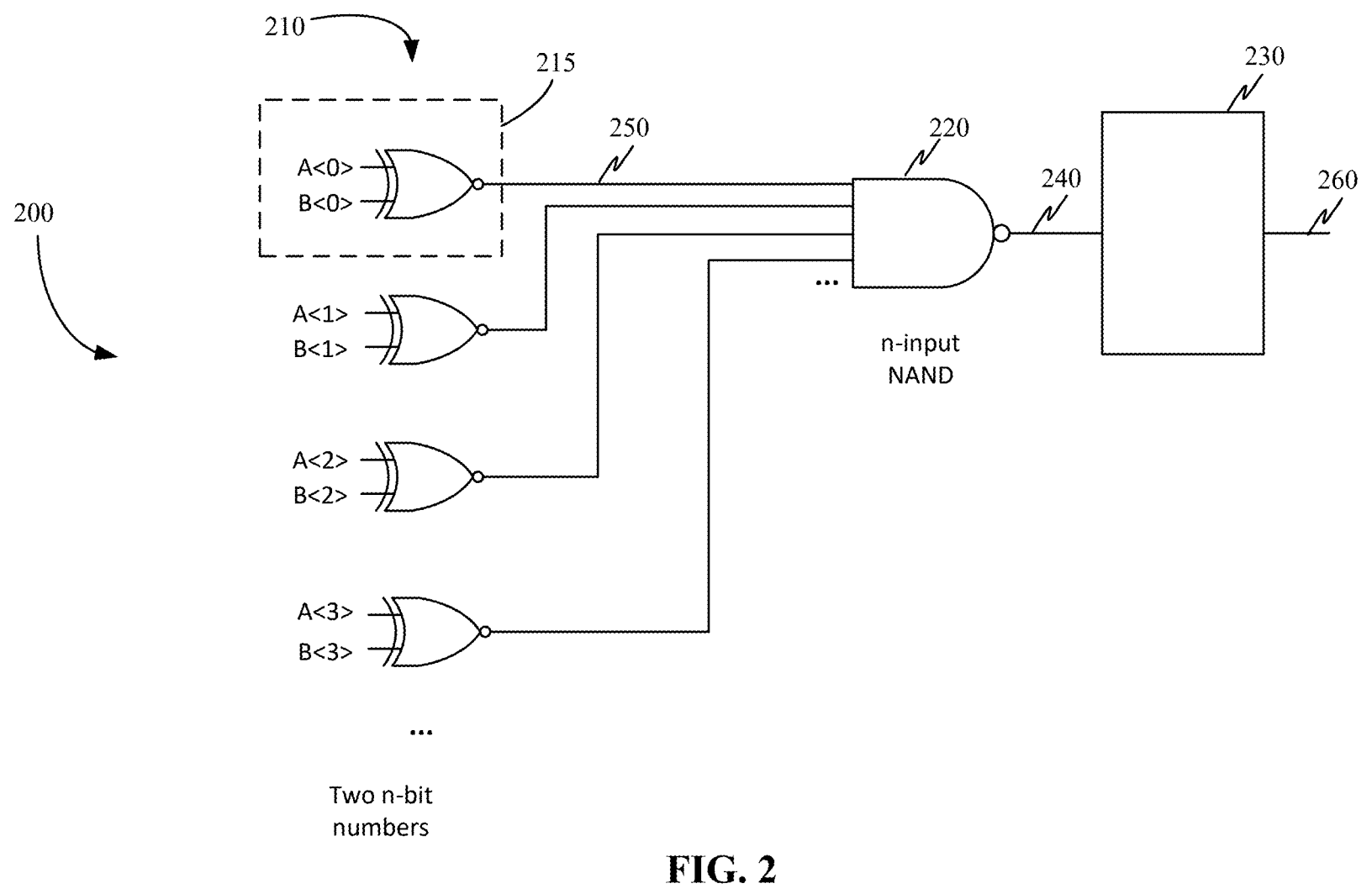

FIG. 2 illustrates an implementation of compare circuitry for the memory circuit of FIG. 1. Referring to FIG. 2, compare circuitry 200, which may be used to implement a compare unit 120 of FIG. 1, can include at a set of XNOR gates 210 coupled to receive two n-bit numbers and a logic gate coupled to the set of XNOR gates to receive the bit compare outputs of each XNOR gate. The two n-bit numbers can be the data input 116 and a corresponding number of bits stored in the memory. Each XNOR gate of the set of XNOR gates 210 performs a comparison of two 1-bit inputs. A detail of an XNOR gate 215 and how it is coupled to other components within a memory circuit is shown in FIG. 3.

Figure 4A:
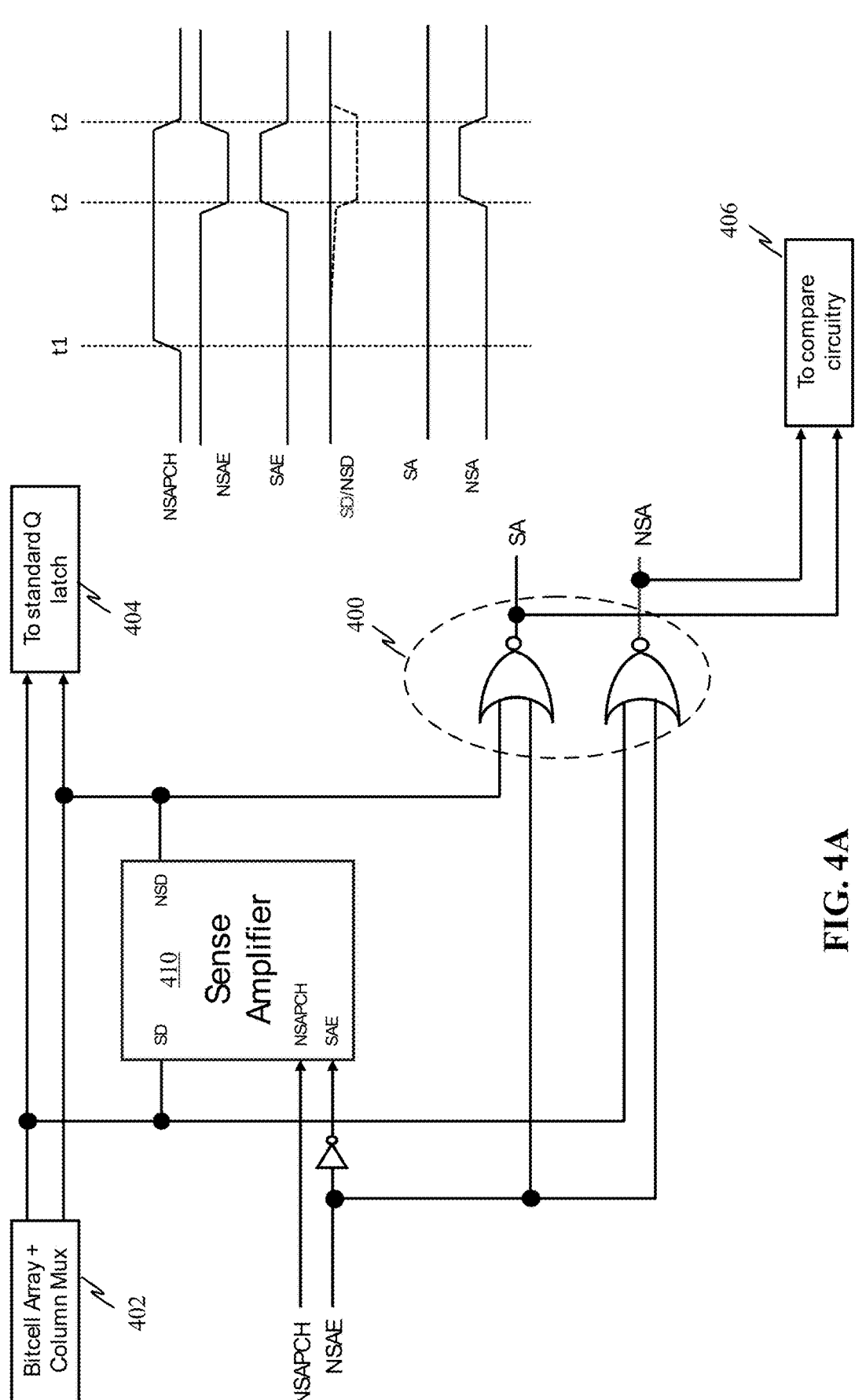
FIGS. 4A and 4B illustrate example implementations of selection logic for a compare circuitry.
Figure 5:
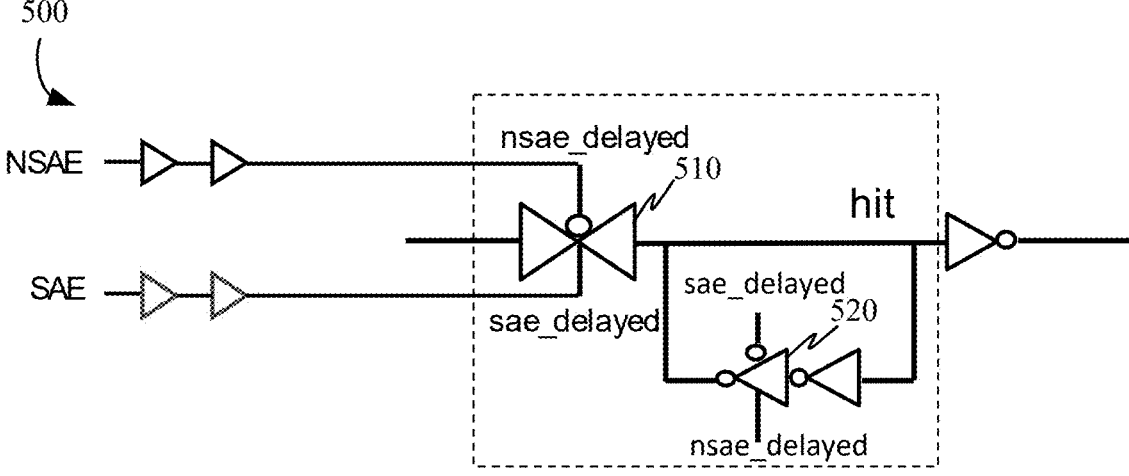
FIG. 5 illustrates an example implementation of a pulsed latch circuit for compare circuitry.

In the illustrated implementation, the XNOR gate is used for each single bit comparison and is able to identify a miss faster than a hit due to the charge/discharge capabilities of the n-type and p-type transistors forming the XNOR gate. As illustrated in more detail with respect to FIG. 4A, since the "miss" is able to be detected faster than a "hit", the compare circuit is precharged to a "hit" value so that when a comparison takes place, only the "miss" requires switching time. The output of each XNOR (e.g., single bit compare output 250) of the set of XNOR gates 210 is combined using an n-input NAND gate 220 to output a comparison result "compare" output 240. The Boolean combination of the XNOR+NAND functions similarly to the equality operator "!=" (not equal to), which returns true if the operands do not have the same value and otherwise returns false. That is, if all bits of the n-bit number stored in the memory array match all bits of the n-bit number of the received address, then the output 240 indicates a hit (e.g., in the illustrated case, a "0" indicates a hit) else the output 240 indicates a miss (e.g., in the illustrated case, a "1" indicates a miss). The compare circuitry 200 can further include a pulsed latch circuit 230 coupled to the output 240 of the NAND gate 220 and can hold the output 240 for a period of time on the latch circuit output 260 so that components outside of the memory circuit have sufficient time to access/receive the correct output value. Details of an implementation of pulsed latch circuit 230 are shown in FIG. 5.

Figure 3:
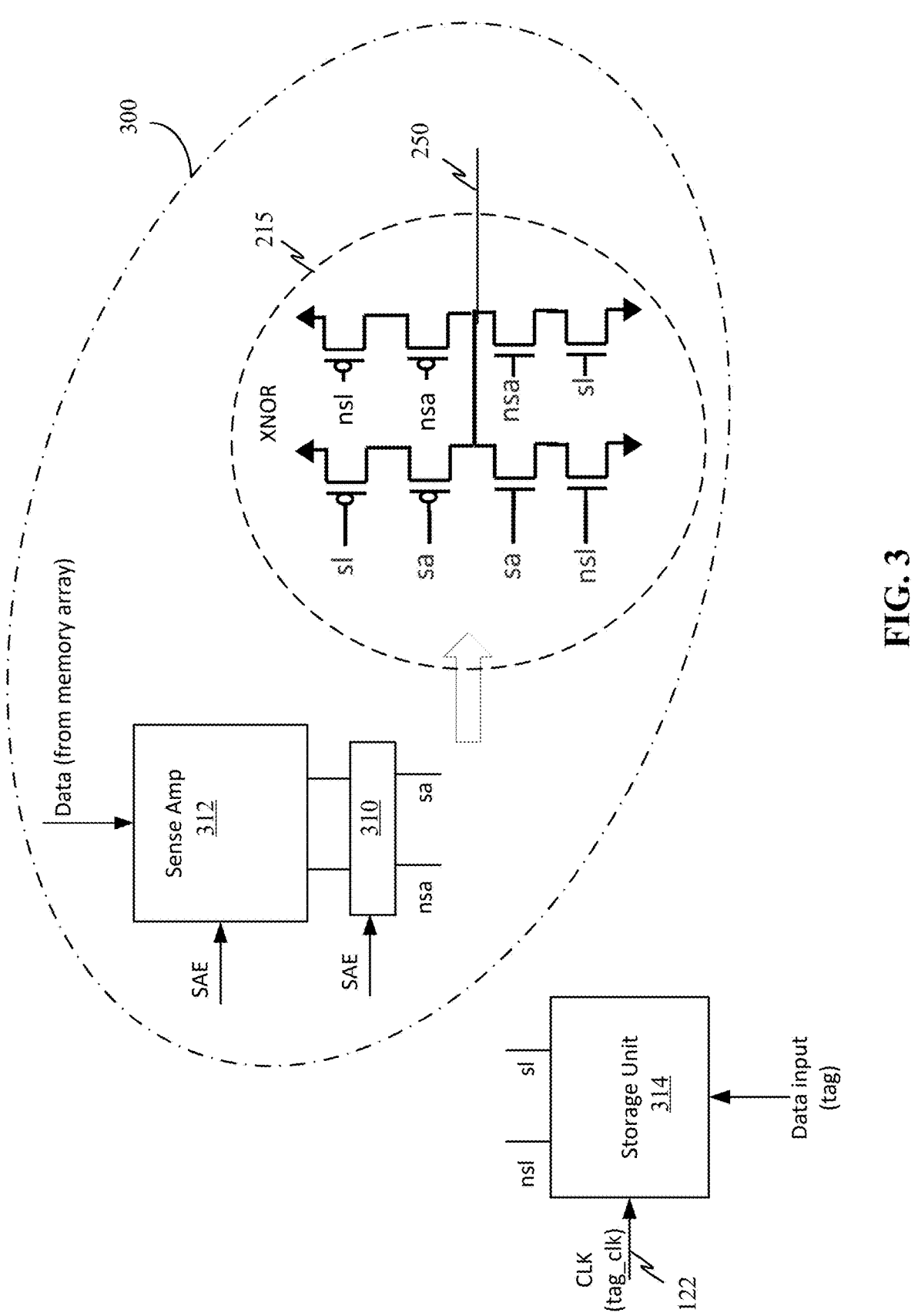
FIG. 3 illustrates a representation of an example compare circuitry.

FIG. 3 illustrates a representation of an example compare circuitry. Referring to FIG. 3, detail of a 1-bit comparison, for example, for inputs to XNOR gate 215 of FIG. 2, is shown. Compare circuitry 300 includes selection logic 310 coupled to a sense amplifier 312 and an XNOR gate 215.

XNOR gate 215 can be implemented using p-type and n-type transistors in technologies such as complementary metal oxide semiconductor (CMOS), silicon-on-insulator (SOI), finfet, and nano-sheet, as some examples. As can be seen, XNOR gate 215 is a single stage, 2 stack XNOR configured using four p-type transistors and four n-type transistors, where a first p-type transistor and a second p-type transistor is in series from a first voltage line to an output node, these two p-type transistors are in parallel with a third p-type transistor and a fourth p-type transistor that are in series from the first voltage line to the output node, a first n-type transistor and a second n-type transistor are in series from the output node to a second voltage line, and these n-type transistors are in parallel with a third n-type transistor and a fourth n-type transistor that are in series from the output node to the second voltage line. Two 1-bit numbers can thus be compared by having one input signal (e.g., sl) connected to the first p-type transistor and the fourth n-type transistor, that input signal's bit bar (e.g., nsl) connected to the third p-type transistor and the second n-type transistor, the other input signal (e.g., sa) connected to the second p-type transistor and the first n-type transistor, and that input signal's bit bar (e.g., nsa) connected to the fourth p-type transistor and the third n-type transistor. This structure enables a faster compare operation than when using an XNOR implemented in two stages with a dual/single stack arrangement.

As mentioned above, the compare circuitry 300 can compare a data input received at a memory circuit and stored data. The data input signal, when received at a memory circuit, can be collected at a clock-controlled storage unit 314, which may be implemented by a register or latch, as examples. The CLK signal 122 controls when the storage unit 314 opens to accept the value of the data input (e.g., data input 116 of FIG. 1) for comparison. However, when the data input bit is updated at the storage unit 314, it is possible for the change to cause a downstream glitch.

Accordingly, instead of directly receiving the output of the sense amplifier 312, the compare circuitry 300 receives the output of the sense amplifier under control of the selection logic 310 and is able to conduct a glitchless compare.

Figure 4B:
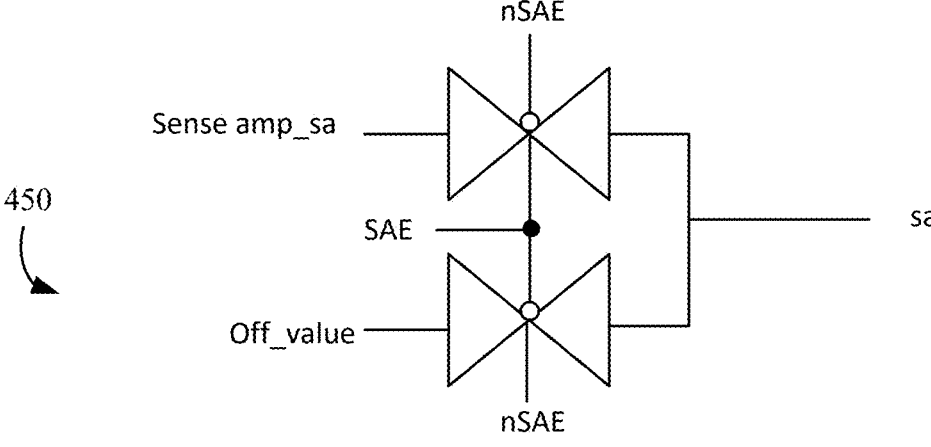
Figure 4B:
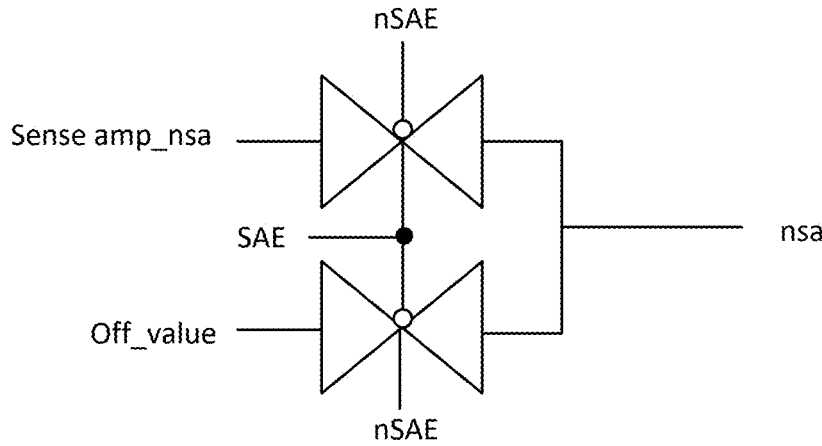

That is, the selection logic 310 is structured to receive a sense amplifier enable (SAE) signal, a column output from the sense amplifier 312, and a column output bar from the sense amplifier 312; and control the manner that the XNOR receives the output of the sense amplifier 312. In particular, the selection logic 310 is structured to pass through the column output (sa) and the column output bar (nsa) when the sense amplifier enable signal is active and hold the column output (sa) and the column output bar (nsa) at a same value when the sense amplifier enable signal is inactive. Example implementation of selection logic 310 is shown in FIGS. 4A and 4B. In some cases, the same value to which the column output and the column output bar is to be held is a logical 0. As will be described in more detail with respect to FIG. 6, it is apparent that if both sa and nsa are 0, it does not matter the value of the data input, providing the sl and nsl signals, since the output of the XNOR gate (single bit output 250 compare result) will remain high.

In some cases, each column (e.g., of memory array 102 of FIG. 1) has a corresponding sense amplifier coupled thereto. In some cases, one sense amplifier is used for reading out more than one column. Thus, there may be one or more XNOR gates coupled to a particular sense amplifier, depending on implementation of the read circuitry.

FIGS. 4A and 4B illustrate example implementations of selection logic for compare circuitry.

Referring to FIG. 4A, an example implementation of selection logic 310 and corresponding timing diagram is shown. Here, selection logic 400 is used to implement selection logic 310 of FIG. 3. Also shown is a sense amplifier 410 (which can be used to implement sense amplifier 312 of FIG. 3). Sense amplifier 410 receives a bit and bit bar signal (for SD and NSD, respectively) from a bitcell array (e.g., of memory array 102) and column multiplexer (e.g., of read circuitry 108) so as to provide the read value, Q, to a Q latch 404.

Selection logic 400 includes two NOR gates. One NOR gate allows the signal from the sense amplifier (SD) to pass through as SA when SAE is active (e.g., using NSAE as the input). The other NOR gate allows the signal bar from the sense amplifier (NSD) to pass through as NSA when SAE is active (e.g., using NSAE as the input). In this manner, SA and NSA can both be held at zero for input to the compare circuitry 406 (e.g., XNOR gate 215) when SAE is inactive.

The timing diagram provides details. As can be seen, while NSAE is high (SAE is low/inactive), SA and NSA are both low (and SD and NSD are both held high). A sense amplifier precharge control signal (NSAPCH) goes high at t1. At t2, the sense amplifier enable signal (SAE) goes high/active, which allows the SD and NSD to pass through as SA and NSA. Here, SD goes low at t2, SA remains low, NSD remains high, NSA goes high. When SAE goes inactive again (e.g., at t3), SA and NSA are both low again.

Referring to FIG. 4B, in some cases, selection logic 450 may be used to implement the selection logic 310 described in FIG. 3. Selection logic 450 can include a passgate that allows the signal from the sense amplifier (Sense amp_sa) to pass through as sa when SAE is active and a passgate that outputs a first value (e.g., an "Off_value") when SAE is inactive. The selection logic 450 further includes a passgate that allows the signal bar from the sense amplifier (Sense amp_nsa) to pass through as nsa when SAE is active and a passgate that outputs the first value (e.g., the "Off_value") when SAE is inactive. In this manner, sa and nsa can be both held at zero (or other same logical value) when SAE is inactive. In some cases, the first value is stored in a register that the two passgates are coupled to. In some cases, each passgate has a corresponding register for storing the "Off_value".

FIG. 5 illustrates an example implementation of a pulsed latch circuit for compare circuitry. Referring to FIG. 5, pulsed latch circuit 500 may be used to implement the pulsed latch circuit 230 shown in FIG. 2. Pulsed latch circuit 500 stores the output of the compare operation (e.g., output 240 of FIG. 2) To further assist with providing a glitchless compare, the pulsed latch circuit 500 can be controlled by the sense amplifier enable (SAE) signal (through a delay) so that the pulsed latch circuit 500 only permits updating when sense amplifier enable signal is active. As can be seen, the delayed SAE (and delayed nSAE) signal operates a passgate 510 and enables an inverter 520. Thus, the pulsed latch on the output is made transparent along with the SAE signal so that the output is transparent before compare output 240 can rise and fall with the SAE signal fall, which is sufficient time to store data properly.

Glitches arise in electronic systems due to temporary fluctuations in a signal that occur as a result of various factors including timing issues. Glitches in a signal path may cause errors in operation of a circuit, for example, creating incorrect logic values at downstream components. As an illustrative scenario, a glitch, or toggling of an input signal to a logic gate, can occur due to an update of the input signal value from an operation in a prior stage before the stage with the logic gate completes its operations. As a result, the output of the logic gate may also change, causing inaccurate results to be propagated downstream as well as creating drain on power (e.g., due to transistor switching). Advantageously, the timing of the signals for the described compare circuitry inhibit potential for glitches downstream.

Figure 6:
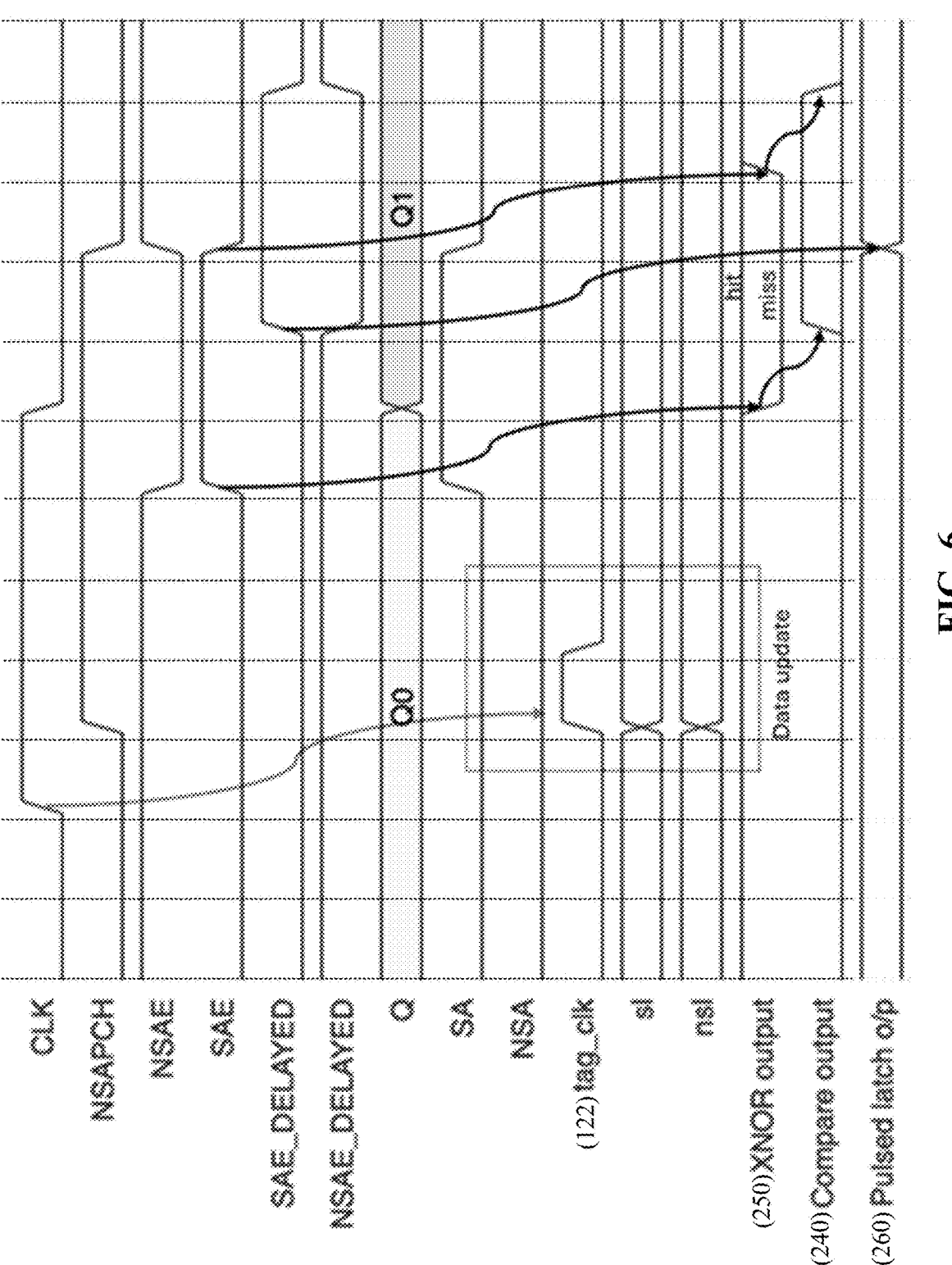
FIG. 6 illustrates a timing diagram of signals used in a compare operation in a memory.

FIG. 6 illustrates a timing diagram of signals used in a compare operation in a memory. In the scenario shown in FIG. 6, operation of a memory circuit with compare circuitry for outputting a hit/miss result is shown. As previously mentioned, the described memory circuit is suitable for use as a tag RAM and is able to provide a fast, glitchless-capable comparison operation in memory. Referring to FIG. 6, a timing diagram is shown for signals CLK, NSAPCH, NSAE and SAE (sense amp enable) and the delayed NSAE and delayed SAE (for the pulsed latch), sa and nsa (corresponding to a stored data bit), tag_clk (see input CLK signal 122 to storage unit 314 of FIG. 3) and sl and nsl (corresponding to a received data input/tag bit for the comparison). The output signals at Q latch of the output data bit (see "to standard Q latch" 404 of FIG. 2), an XNOR output (see output 250 of FIG. 2), compare output (see output 240 of FIG. 2), and pulsed latch output (see output 260 of FIG. 2) are also shown. As can be seen, when sense amplifier enable signal (SAE) is inactive, nsa and sa are held by selection logic to both be low. As mentioned with respect to FIG. 3, because both nsa and sa are at the logical zero, the XNOR output (250) stays high regardless of any data updates/changes at the data input (reflected by sl and nsl). The two values, sl and nsl, can toggle (shown on the diagram as X) between high and low values (e.g., 0 and 1) before the SAE signal becomes active (e.g., when the SAE signal is high) and there is no change at the XNOR output 250. When the sense amplifier enable signal is active (e.g., when the SAE signal is high), nsa and sa are allowed pass through the selection logic and reflect their true values (which are opposite to each other).

Advantageously, not only is the described compare circuitry able to prevent a glitch due to data input timing, the operation result is fast. The speed of the operation result is possible by placement of the switching devices (e.g., the transistors of the XNOR gates near the output from the memory array and the ability to only have 1 signal that toggles instead of many signals toggling. Indeed, in certain implementations, the compare circuitry can deliver the hit/miss signal within 5% after the standard access time of the memory with no spurious glitching.

For example, with reference to FIG. 3 and FIG. 6, in a first case, when the value of the data input is zero, (e.g., sl is zero) and sa is rising, the XNOR output 250 falls through a stack of two (i.e., first and second n-type transistors) and a miss signal (compare output 240) goes high with a minimal time delay as a result of rising through a stack of one (in the NAND gate 220). In a second case, when the value of the data input is one (e.g., sl is one) and nsa is rising, the XNOR output 250 falls through a stack of two (i.e., third and fourth n-type transistors) and the miss signal (compare output 240) goes high with minimal delay as a result of rising through a stack of one (in the NAND gate 220). In a third case, when the value of the data input is zero, and nsa is rising, the XNOR output 250 stays high and the miss signal (compare output 240) stays low (indicating a hit) with no toggling. Similarly, in a fourth case, when the data input is one, and sa is rising, the XNOR output 250 stays high and the miss signal (compare output 240) stays low (indicating a hit) with no toggling. The fast-rising miss signal is enabled due to the transistor circuitry of the particular logic circuitry of the XNOR+NAND configuration in that the signal only needs to pass through one transistor instead of two or more in series.

In addition, with respect to the pulsed latch on the output, since the pulsed latch is controlled by the SAE signal (through a delay), in the case of a HIT, as soon as the latch opens, the output miss falls. In addition, in the case of a MISS, when the compare output 240 rises (through a stack of 1 p-type transistor), the output miss falls. The pulse latch holds the last operation until the new operation is ready. By holding the last operation until the new operation is ready, an output glitch can be avoided.

As can be seen, a method of performing a fast and glitchless compare in memory can include receiving, at a memory circuit, an address for lookup and a data input for comparing to stored data, wherein the memory circuit comprises a memory array, read circuitry coupled to columns of the memory array; and a compare circuitry coupled to the read circuitry; providing a sense amplifier enable signal and column select signals of the address for lookup to the read circuitry; and comparing stored data from the address for lookup with the data input. The comparing of the stored data from the address for lookup with the data input can include providing the sense amplifier enable signal to selection logic of the compare circuitry, wherein the selection logic is structured receive the sense amplifier enable signal, a column output from a sense amplifier of the read circuitry, and a column output bar from the sense amplifier, the selection logic being further structured to pass through the column output and the column output bar when the sense amplifier enable signal is active and hold the column output and the column output bar at a same value when the sense amplifier enable signal is inactive; and providing the data input to an XNOR gate that is structured to receive the column output comparing the data input and the column output bar passed through the selection logic, the data input, and a data input bar, the XNOR gate being structured to output a bit compare output.

The method can further include providing the sense amplifier enable signal to a pulsed latch circuit, wherein the pulsed latch circuit is coupled to an output of a logic gate that is structured to receive the bit compare output of the XNOR gate, wherein the pulsed latch circuit is structured to capture the output of the logic gate when the sense amplifier enable signal is active.

In addition, the method can further include providing a clock signal and the data input to a storage unit structured to provide the data input and the data input bar to the XNOR gate.

The selection logic can include two NOR gates, a first NOR gate of the two NOR gates coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates coupled to the column output from the sense amplifier and the signal line of the sense amplifier enable bar, the second NOR gate allowing the column output bar from the sense amplifier to pass through when the sense amplifier enable signal is active, otherwise outputting a zero.

Certain embodiments of the illustrated methods and circuitry include the following.

Clause 1. A memory circuit for performing a compare in memory, the memory circuit comprising: a memory array; read circuitry coupled to columns of the memory array, the read circuitry comprising a sense amplifier; and a compare circuitry comprising: selection logic coupled to the sense amplifier, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and an XNOR gate structured to receive the column output and the column output bar passed through the selection logic, a data input, and a data input bar and output a bit compare output.

Clause 2. The memory circuit of clause 1, further comprising a logic gate coupled to receive the bit compare output of the XNOR gate.

Clause 3. The memory circuit of clause 2, wherein the logic gate is a NAND gate.

Clause 4. The memory circuit of clause 3, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and output a corresponding bit compare output.

Clause 5. The memory circuit of any of clauses 2-4, further comprising a pulsed latch circuit coupled to an output of the logic gate, wherein the pulsed latch circuit is structured to capture the output from the logic gate when the sense amplifier enable signal is active.

Clause 6. The memory circuit of any preceding clause, further comprising a clock-controlled storage unit that is structured to provide the data input and the data input bar to the XNOR gate, the clock-controlled storage unit being structured to receive a data bit for comparison by the compare circuitry.

Clause 7. The memory circuit of any preceding clause, wherein the selection logic comprises: two NOR gates, wherein: a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

Clause 8. The memory circuit of any preceding clause, wherein the data input is a tag bit of an address for lookup and the column output is a stored tag bit.

Clause 9. A compare circuitry comprising: selection logic coupled to a sense amplifier of a memory circuit, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and an XNOR gate structured to receive the column output and the column output bar passed through the selection logic, a data input, and a data input bar and output a bit compare output.

Clause 10. The compare circuitry of clause 9, further comprising a NAND gate coupled to receive the bit compare output of the XNOR gate.

Clause 11. The compare circuitry of clause 10, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and output a corresponding bit compare output.

Clause 12. The compare circuitry of clause 11, further comprising a pulsed latch circuit coupled to an output of the NAND gate, wherein the pulsed latch circuit is structured to capture the output from the NAND gate when the sense amplifier enable signal is active.

Clause 13. The compare circuitry of any of clauses 9-12, further comprising a clock-controlled storage unit that is structured to provide the data input and the data input bar to the XNOR gate, the clock-controlled storage unit being structured to receive a data bit for comparison by the compare circuitry.

Clause 14. The compare circuitry of any of clauses 9-13, wherein the selection logic comprises: two NOR gates, wherein: a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

Clause 15. A method of performing a compare in memory, the method comprising: receiving, at a memory circuit, an address for lookup and a data input for comparing to stored data, wherein the memory circuit comprises a memory array, read circuitry coupled to columns of the memory array; and a compare circuitry coupled to the read circuitry; providing a sense amplifier enable signal and column select signals of the address for lookup to the read circuitry; and comparing stored data from the address for lookup with the data input, wherein the comparing comprises: providing the sense amplifier enable signal to selection logic of the compare circuitry, wherein the selection logic is structured receive the sense amplifier enable signal, a column output from a sense amplifier of the read circuitry, and a column output bar from the sense amplifier, the selection logic being further structured to pass through the column output and the column output bar when the sense amplifier enable signal is active and hold the column output and the column output bar at a same value when the sense amplifier enable signal is inactive; and providing the data input to an XNOR gate that is structured to receive the column output comparing the data input and the column output bar passed through the selection logic, the data input, and a data input bar, the XNOR gate being structured to output a bit compare output.

Clause 16. The method of clause 15, further comprising: providing the sense amplifier enable signal to a pulsed latch circuit, wherein the pulsed latch circuit is coupled to an output of a NAND gate that is structured to receive the bit compare output of the XNOR gate, wherein the pulsed latch circuit is structured to capture the output of the NAND gate when the sense amplifier enable signal is active.

Clause 17. The method of clause 16, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and outputs a corresponding bit compare output.

Clause 18. The method of any of clauses 15-17, further comprising: providing a clock signal and the data input to a storage unit structured to provide the data input and the data input bar to the XNOR gate.

Clause 19. The method of any clauses 15-18, wherein the selection logic comprises: two NOR gates, wherein: a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

Clause 20. The method of any of clauses 15-19, wherein: when the data input is zero and the column output is one, the XNOR gate output falls through a stack of two, and the compare output goes high by rising through a stack of one; when the data input is one and the column output bar is one, the XNOR gate output falls through the stack of two and the compare output goes high by rising through a stack of one; when the data input is zero and column output bar is one, the XNOR gate output stays high and the compare output stays low, indicating a hit; when the data input is one and column output is one, the XNOR gate output stays high and the compare output stays low, indicating a hit.

Clause 21. The method of any of clauses 15-20 performed on a memory circuit of any of clauses 1-8.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A memory circuit for performing a compare in memory, the memory circuit comprising:
a memory array;
read circuitry coupled to columns of the memory array, the read circuitry comprising a sense amplifier; and
a compare circuitry comprising:
selection logic coupled to the sense amplifier, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and
an XNOR gate structured to receive the column output and the column output bar passed through the selection logic, a data input, and a data input bar and output a bit compare output.

2. The memory circuit of claim 1, further comprising a logic gate coupled to receive the bit compare output of the XNOR gate.

3. The memory circuit of claim 2, wherein the logic gate is a NAND gate.

4. The memory circuit of claim 3, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and output a corresponding bit compare output.

5. The memory circuit of claim 4, further comprising a pulsed latch circuit coupled to an output of the NAND gate, wherein the pulsed latch circuit is structured to capture the output from the NAND gate when the sense amplifier enable signal is active.

6. The memory circuit of claim 1, further comprising a clock-controlled storage unit that is structured to provide the data input and the data input bar to the XNOR gate, the clock-controlled storage unit being structured to receive a data bit for comparison by the compare circuitry.

7. The memory circuit of claim 1, wherein the selection logic comprises:
two NOR gates, wherein:
a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and
a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

8. The memory circuit of claim 1, wherein the data input is a tag bit of an address for lookup and the column output is a stored tag bit.

9. A compare circuitry comprising:
selection logic coupled to a sense amplifier of a memory circuit, the selection logic structured to receive a sense amplifier enable signal, a column output from the sense amplifier, and a column output bar from the sense amplifier, wherein the selection logic is structured to pass through the column output and the column output bar when the sense amplifier enable signal is active and hold the column output and the column output bar at a same value when the sense amplifier enable signal is inactive; and
an XNOR gate structured to receive the column output and the column output bar passed through the selection logic, a data input, and a data input bar and output a bit compare output.

10. The compare circuitry of claim 9, further comprising a NAND gate coupled to receive the bit compare output of the XNOR gate.

11. The compare circuitry of claim 10, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and output a corresponding bit compare output.

12. The compare circuitry of claim 11, further comprising a pulsed latch circuit coupled to an output of the NAND gate, wherein the pulsed latch circuit is structured to capture the output from the NAND gate when the sense amplifier enable signal is active.

13. The compare circuitry of claim 9, further comprising a clock-controlled storage unit that is structured to provide the data input and the data input bar to the XNOR gate, the clock-controlled storage unit being structured to receive a data bit for comparison by the compare circuitry.

14. The compare circuitry of claim 9, wherein the selection logic comprises:

two NOR gates, wherein:

a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

15. A method of performing a compare in memory, the method comprising:

receiving, at a memory circuit, an address for lookup and a data input for comparing to stored data, wherein the memory circuit comprises a memory array, read circuitry coupled to columns of the memory array; and a compare circuitry coupled to the read circuitry;

providing a sense amplifier enable signal and column select signals of the address for lookup to the read circuitry; and comparing stored data from the address for lookup with the data input, wherein the comparing comprises:

providing the sense amplifier enable signal to selection logic of the compare circuitry, wherein the selection logic is structured receive the sense amplifier enable signal, a column output from a sense amplifier of the read circuitry, and a column output bar from the sense amplifier, the selection logic being further structured to pass through the column output and the column output bar when the sense amplifier enable signal is active and hold the column output and the column output bar at a same value when the sense amplifier enable signal is inactive; and providing the data input to an XNOR gate that is structured to receive the column output comparing the data input and the column output bar passed through the selection logic, the data input, and a data input bar, the XNOR gate being structured to output a bit compare output.

16. The method of claim 15, further comprising:

providing the sense amplifier enable signal to a pulsed latch circuit, wherein the pulsed latch circuit is coupled to an output of a NAND gate that is structured to receive the bit compare output of the XNOR gate, wherein the pulsed latch circuit is structured to capture the output of the NAND gate when the sense amplifier enable signal is active.

17. The method of claim 16, wherein the NAND gate receives outputs from a set of XNOR gates that includes the XNOR gate, each XNOR gate of the set of XNOR gates structured to receive a corresponding column output and corresponding column output bar from a corresponding selection logic, corresponding data input, and corresponding data input bar and outputs a corresponding bit compare output.

18. The method of claim 15, further comprising:

providing a clock signal and the data input to a storage unit structured to provide the data input and the data input bar to the XNOR gate.

19. The method of claim 15, wherein the selection logic comprises:

two NOR gates, wherein:

a first NOR gate of the two NOR gates is coupled to the column output bar from the sense amplifier and a signal line of a sense amplifier enable bar, the first NOR gate allowing the column output from the sense amplifier to pass through when the sense amplifier enable signal is active otherwise outputting a zero; and a second NOR gate of the two NOR gates is coupled to the column output from the sense amplifier and the signal line of the sense amplifier enable bar, the second NOR gate allowing the column output bar from the sense amplifier to pass through when the sense amplifier enable signal is active, otherwise outputting a zero.

20. The method of claim 15, wherein:

when the data input is zero and the column output is one, the XNOR gate output falls through a stack of two, and the compare output goes high by rising through a stack of one;

when the data input is one and the column output bar is one, the XNOR gate output falls through the stack of two and the compare output goes high by rising through a stack of one;

when the data input is zero and column output bar is one, the XNOR gate output stays high and the compare output stays low, indicating a hit;

when the data input is one and column output is one, the XNOR gate output stays high and the compare output stays low, indicating a hit.

* * * * *